(12) United States Patent
Foster et al.

(10) Patent No.: US 7,675,162 B2
(45) Date of Patent: Mar. 9, 2010

(54) INTERCONNECT STRUCTURE USING THROUGH WAFER VIAS AND METHOD OF FABRICATION

(75) Inventors: John S. Foster, Santa Barbara, CA (US); Steven H. Hovey, Goleta, CA (US); Paul J. Rubel, Santa Barbara, CA (US); Kimon Rybnicek, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 168 days.

(21) Appl. No.: 11/541,774

(22) Filed: Oct. 3, 2006

(65) Prior Publication Data

US 2008/0079120 A1 Apr. 3, 2008

(51) Int. Cl.
*H01L 23/10* (2006.01)

(52) U.S. Cl. ............... 257/704; 257/E23.193; 438/51

(58) Field of Classification Search ........... 257/698, 257/700, 704
See application file for complete search history.

(56) References Cited

U.S. PATENT DOCUMENTS

| | | | |
|---|---|---|---|
| 5,534,466 A * | 7/1996 | Perfecto et al. ............... 216/20 |
| 5,573,171 A * | 11/1996 | Kong et al. ............... 228/123.1 |
| 6,046,074 A * | 4/2000 | McHerron et al. ........... 438/119 |
| 6,181,569 B1 * | 1/2001 | Chakravorty ................ 361/761 |
| 6,225,145 B1 * | 5/2001 | Choi et al. ................... 438/120 |
| 6,407,345 B1 * | 6/2002 | Hirose et al. ................ 174/261 |
| 6,472,306 B1 | 10/2002 | Lee et al. |
| 6,514,671 B1 | 2/2003 | Parikh et al. |
| 6,528,874 B1 * | 3/2003 | Iijima et al. .................. 257/700 |
| 6,566,239 B2 * | 5/2003 | Makino et al. ............... 438/612 |
| 6,781,239 B1 * | 8/2004 | Yegnashankaran et al. .. 257/777 |
| 6,809,412 B1 * | 10/2004 | Tourino et al. ............... 257/678 |
| 6,894,358 B2 * | 5/2005 | Leib et al. .................... 257/414 |
| 7,393,758 B2 * | 7/2008 | Sridhar et al. ................ 438/460 |
| 2003/0104651 A1 * | 6/2003 | Kim et al. .................... 438/106 |
| 2005/0003631 A1 * | 1/2005 | Feierabend et al. .......... 438/459 |
| 2005/0139940 A1 * | 6/2005 | Patel et al. ................... 257/414 |
| 2005/0194677 A1 * | 9/2005 | Heschel et al. ............... 257/704 |
| 2007/0029654 A1 * | 2/2007 | Sunohara et al. ............. 257/678 |
| 2007/0045781 A1 * | 3/2007 | Carlson et al. ............... 257/632 |
| 2007/0096294 A1 * | 5/2007 | Ikeda et al. .................. 257/704 |

OTHER PUBLICATIONS

"Thin Film Inductive Heads," A. Chiu, et al., IBM J. Res. Develop, vol. 40 No. 3, May 1996, pp. 283-300.
"Embedded Conductor Technology for Micromachined RF Elements," Y. Yoon, et al., J. Micromech. Microengin. 15 (2005), pp. 1317-1326.

* cited by examiner

*Primary Examiner*—Sue Purvis
*Assistant Examiner*—Benjamin P Sandvik
(74) *Attorney, Agent, or Firm*—Jacquelin K. Spong

(57) ABSTRACT

A device and a method are described which hermetically seals at least one microstructure within a cavity. Electrical access to the at least one microstructure is provided by through wafer vias formed through a via substrate which supports the at least one microstructure on its front side. The via substrate and a lid wafer may form a hermetic cavity which encloses the at least one microstructure. The through wafer vias are connected to bond pads located outside the cavity by an interconnect structure formed on the back side of the via substrate. Because they are outside the cavity, the bond pads may be placed inside the perimeter of the bond line forming the cavity, thereby greatly reducing the area occupied by the device. The through wafer vias also shorten the circuit length between the microstructure and the interconnect, thus improving heat transfer and signal loss in the device.

24 Claims, 15 Drawing Sheets

INTERCONNECT STRUCTURE USING THROUGH WAFER VIAS AND METHOD OF FABRICATION

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to interconnect structures and packaging technology for encapsulated devices. In particular, this invention relates to a method and device for providing electrical access to encapsulated MEMS devices which have been hermetically sealed.

Telephone and other communications devices require a large number of switches to form the connections to activate the telephone calls. In general, the switches may be configured to connect any input line to any output line, and may therefore form a "cross connect." In order to miniaturize the component, the individual switches, of which there may be on the order of hundreds or even thousands, may be made using microelectromechanical systems, or MEMS. One common example of a MEMS switch usable for making a cross connect is a bi-metal strip, wherein two dissimilar metals are laminated against each other to form each of two arms of the bimetal switch. By applying a current to the arms of the switch, the bi-metal switch heats up. The different coefficients of thermal expansion of each material cause each arm of the bi-metal switch to bend in a particular direction, establishing or discontinuing contact with the other arm of the bi-metal switch, for example. Therefore, the plurality of switches may be activated by delivering current to each arm of the switch, in order to heat the switch and drive it to its closed (or open) position.

The voltages carried in the telephone connections can exceed 400 V, and because of the large number of lines being connected by the cross connect, the cross connect may be required to carry an ampere or more of current. Because of these current and voltage requirements, many telephone switches are hermetically enclosed in insulating gas environments which inhibit arcing between the high voltage lines. Such insulating gases may include, for example, sulfur hexafluoride ($SF_6$) or freons $CCl_2F_2$, or $C_2Cl_2F_4$. The use of such insulating gases may increase the breakdown voltage compared to that of air by about a factor of three.

However, in order to seal the insulating gases in the switch device, the adhesive material which forms the bond between the substrate containing the electrical connections to the switches, and the cap layer which encloses the switch, must be a hermetic, i.e., non-leaking seal.

Furthermore, the electrical leads which provide electrical access to the switch device must be capable of carrying relatively high currents, and relatively high voltages. In order to keep the resistance low, and therefore the generated heat low, the electrical leads must be made relatively thick, and need to be well separated from each other in order to reduce capacitive coupling between the leads. The reduction in capacitive coupling is particularly important for leads carrying high frequency signals, such as telephone signals or radio frequency (rf) signals.

Therefore, for cross connect structures such as telephone switches, a relatively larger number, for example, 96 switches, need to be accessed electrically. As each switch may require a activation lead, a ground lead, and a signal line, a 96 switch device may require 96×2×3 electrical leads, or 576 electrical leads. If the two sides of the switch share a ground lead, this translates into 480 electrical connections. In order to avoid routing all of these electrical connections in a single plane out to bonding pads at the periphery of the device, the connections may be made by an interconnect, a structure with, for example, two or more parallel planes of conductor metallizations, separated by dielectric layers. Interconnections may then be made between the planes to access each of the electrical devices.

SUMMARY

Typically, interconnection between metallization layers may be made on a printed circuit board, however this technology does not form a hermetic seal and may therefore not be suitable for telephone switches.

Interconnection technology is also well known in the semiconductor arts, as the formation of vias between metallization layers. However, this via methodology may not be applicable to telephone switches, because these switches require relatively thick metal layers required to transport large amounts of current and thick insulating layers needed to reduce capacitive coupling between the metallization layers.

Other methods for forming interconnections may be employed, such as plating interconnect studs through an insulating layer. However, the interface between the plated layer and the insulating layer may also not form a hermetic seal, as voids often form when plating into very high aspect ratio features. In addition, if rigid glass or other dielectric is used as the insulating layer, cracks may form at the interface when the device is operated over a wide temperature range, because the glass or other dielectric cannot accommodate the different coefficients of thermal expansion of the materials in the switch.

Systems and methods are described here for formation of a device, suitable for a telephone cross connect switch. The device may have an enclosure for the MEMS switch device which is hermetic, and may have an interconnect matrix on the back side of a via substrate, and the MEMS switch device is formed on the front side of the via substrate. The via substrate may have a plurality of through wafer vias, which provide electrical access to the MEMS device. The via substrate may be bonded hermetically to a lid wafer, so that the hermetic cavity is formed between the via substrate and the lid wafer and encapsulates the MEMS device. The hermetic seal may be formed, in part, by conductive pads deposited over the through wafer vias, which overlap and extend slightly beyond the perimeter of the through wafer via.

The interconnect structure is then formed on the back side of the via substrate, and therefore need not, in itself, be hermetic. Because the interconnect structure need not be hermetic, materials can be chosen for cost and convenience, rather than hermeticity. Also, because the back side of the via substrate is outside the hermetic structure, the electrical pads which are used to probe the device and connect it to controlling circuitry may be located within the footprint of the hermetic cavity, thus substantially decreasing the total size of the finished die and increasing the number of die which can be fabricated on a single wafer. The density of die on a wafer is a primary driver of cost associated with the manufacture of such devices.

The interconnect structure may have relatively thick layers, and is therefore suitable for manufacturing telephone switches. Since the via substrate, lid wafer and bonding adhesive may have matched coefficients of thermal expansion, the encapsulated device may be used over a relatively large temperature range without forming leaks.

Since the interconnect matrix is formed on the backside of the substrate and the MEMS device is formed on the front side, the interconnect matrix need not be planarized, because no precision lithography will be performed on its surfaces. This may substantially simplify process development and improve yields.

In addition, because the vias route the electrical signal vertically through the substrate, there may be less capacitive coupling between the signal lines and the metal bond line adhering the lid wafer to the via substrate. The through wafer vias also provide effective heat sinking so that the device is capable of handling relatively large currents. The through wafer vias provide a very short circuit length between the MEMS device and the interconnect, such that heat transfer, cross-talk, inductance, and signal loss are improved relative to designs using longer circuit lengths.

The through wafer vias may be formed by first deep reactive ion etching blind holes with dead end walls in a silicon substrate, and then plating a conductive material in the blind holes. The blind holes may then be covered by gold pads, which may improve the hermeticity of the vias, by sealing microcracks and leak paths which may have formed in the plating process.

The microstructure is then formed on the front side surface of the via substrate, and hermetically sealed in a cap or lid wafer. The back side of the via wafer is then ground or etched to remove the dead end walls of the blind holes, so that the vias now extend through the substrate.

The interconnect structure may then be formed by depositing a layer of photo-patternable polymer, or any other dielectric material, on the back side of the via substrate. The photo-patternable polymer may then be patterned so as to expose the interconnect structures. After developing, the photo-patternable polymer may be cross-linked or cured, as it may remain on the substrate to form the dielectric layer between the subsequent circuit metallization and the substrate. A seed layer for the deposition of the metallization may then be deposited, followed by another layer of photo-patternable polymer. The photo-patternable polymer is patterned according to the desired circuit layout, and the metallization is then deposited by, for example, plating onto the seed layer, and the photo-patternable polymer is then stripped from the via substrate. The remaining exposed seed layer is then also stripped from the substrate.

Another layer of photo-patternable polymer may then be deposited and patterned to begin the next dielectric layer. These process steps may then be repeated as many times as necessary to produce the desired number of interconnect layers.

Accordingly, the finished device includes a via substrate with at least one via extending through a thickness of the via substrate, at least one microstructure disposed on a front side of the via substrate, and electrically coupled to the at least one via, and an interconnect structure formed on a back side of the via substrate, including at least one layer of metallization and at least one layer of dielectric material, wherein the at least one layer of metallization is electrically coupled to the at least one via through the at least one layer of dielectric material.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

In the systems and methods described herein, an interconnect structure is fabricated which may be particularly suited for telephone switches which may need to accommodate a large number of electrical leads. The leads may be required to carry large voltages and large currents, and may therefore be thick and separated by thick insulating layers. Although the systems and methods are described with respect to a MEMS telephone switch embodiment, it should be understood that this embodiment is exemplary only, and that the systems and methods may be applied to any device benefiting from shortened circuit lengths and reduced die size.

Furthermore, the systems and methods are described with respect to a particular design of MEMS switch. However, it should be understood that this particular design of MEMS switch is exemplary only, and that the systems and methods described herein can be applied to any number of alternative designs of MEMS switches or other devices. Furthermore, the systems and methods described herein may be applicable to any microstructure, both MEMS and non-MEMS devices, such as integrated circuit devices.

It should also be understood that in the figures which follow, the various dimensions are not necessarily drawn to scale, but instead are intended to illustrate the important aspects of the device.

Figure 1:
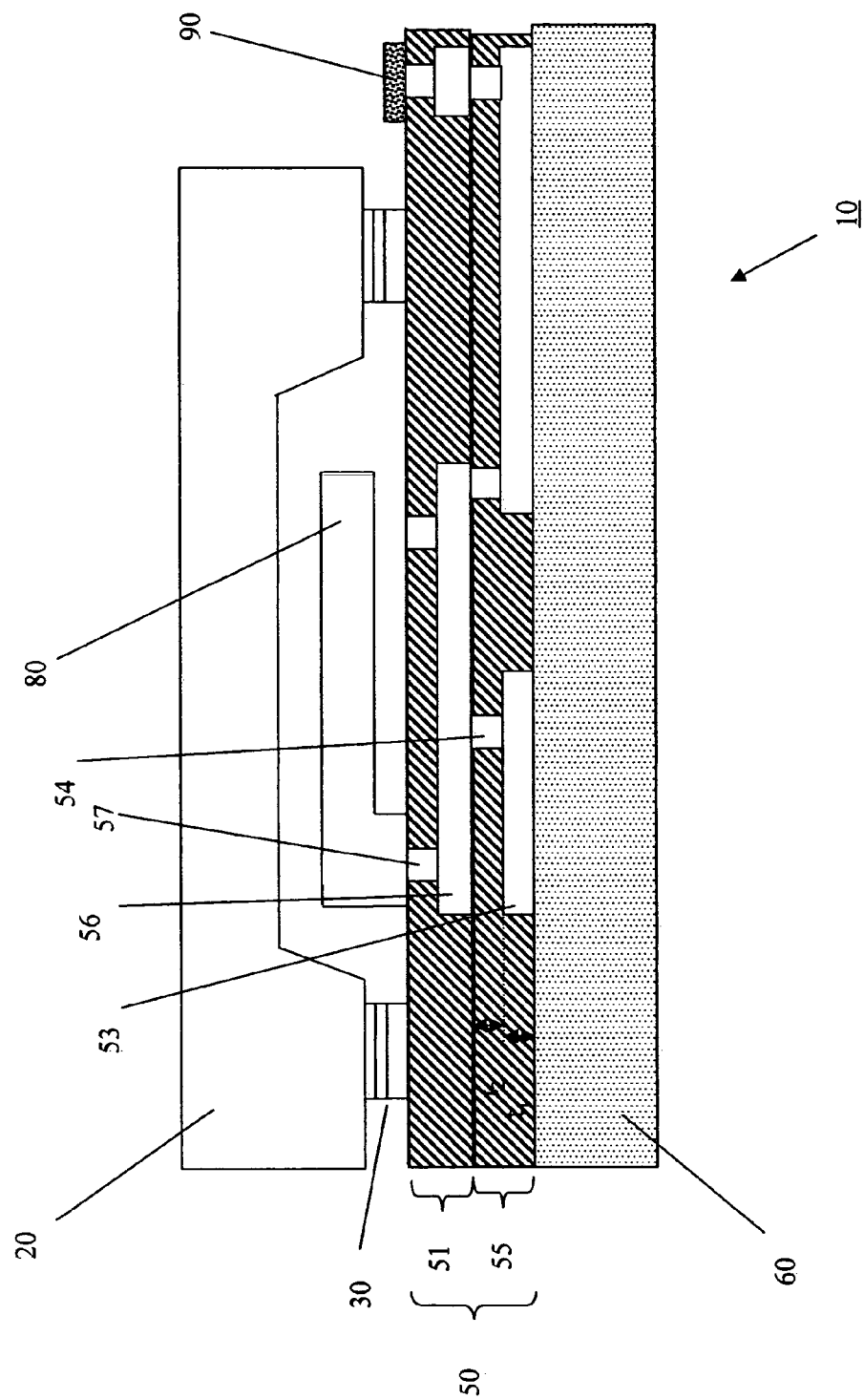
FIG. 1 is an exemplary embodiment of a hermetic switch package with an interconnect structure.

FIG. 1 is a cross sectional side view of hermetic switch device 10 as described in U.S. patent application Ser. No. 11/211,625, assigned to the same assignee as the present application and incorporated by reference in its entirety. Hermetic device 10 includes a lid or cap 20, which covers and seals a switch structure 80. The lid or cap 20 is secured to the interconnect layers 50 by an alloy seal 30. The switch structure 80 is formed over interconnect layers 50, which are in turn formed on a substrate 60. The substrate 60 may be any convenient material, such as thermally oxidized silicon, which is widely used in semiconductor processing, which may provide a fabrication plane for the interconnect layers 50 and the switch structures 80. Although the switch structure 80 is shown in FIG. 1 to be a cantilevered beam, it should be appreciated that the approach to hermetic device 10 shown in FIG. 1 may be applied to a large number of MEMS devices, such as actuators and sensors, in addition to switches.

The interconnect layers 50 may include two interconnect layers 51 and 55. Each of the interconnect layers 51 and 55 further includes a plated layer of metallization 53 and 56, respectively, and a plated stud, 54 and 57, respectively, surrounded by a dielectric material. The thickness $t_1$ of the first metallization layer may be, for example, about 4 μm, and the thickness $t_2$ of the plated stud 54 may also be, for example, about 4 μm.

One problem with the hermetic switch device 10 shown in FIG. 1 is that the layer of dielectric material in interconnect layers 51 and 55 may be a layer of silicon dioxide about 4 μm thick, which may require a substantial amount of time to form. Also, hermetic switch device 10 has the electrical pads 90 located outside of the perimeter of the alloy seal 300. For a hermetic switch device having a large number of individual switches 80, a large number of pads 90 may be required, which may dramatically increase the area used by the hermetic switch device 10.

Figure 2:
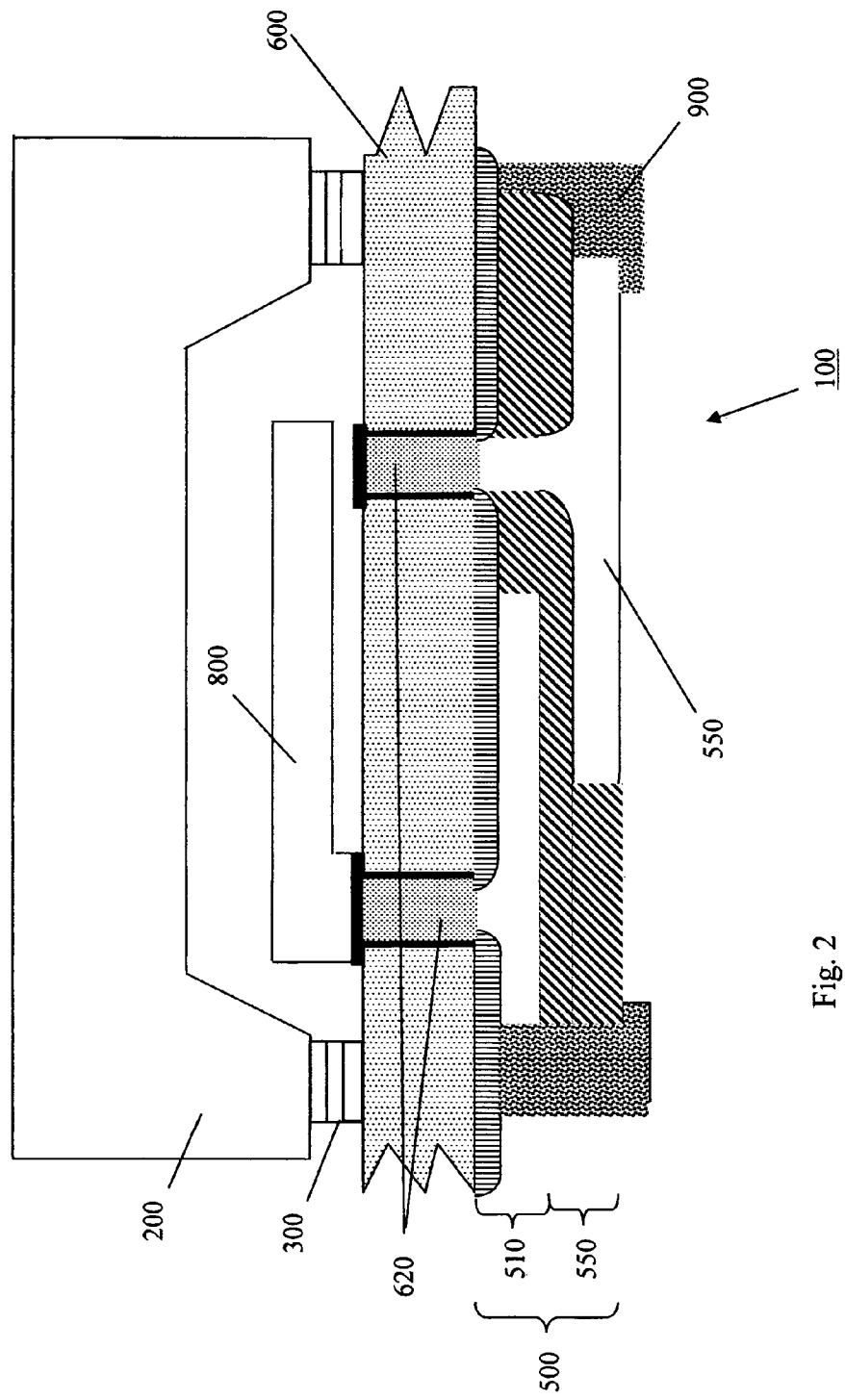
FIG. 2 is an exemplary embodiment of a hermetic device using an interconnect structure with through wafer vias.

FIG. 2 is a schematic illustration of another switch device 100. In this switch device 100, the interconnect layers 510 and 550 are formed below the substrate 600, rather than above it as in hermetic switch 10. In addition, electrical access to the microstructure 800 in switch device 100 is gained using through wafer vias 620 in a via substrate 600 upon which the microstructure 800 is built. The term "through wafer vias" should be understood to mean a conductive via structure which extends through a thickness of a substrate.

A hermetic cavity for device 100 may then be formed between the lid wafer 200 and the through via substrate 600, rather than between the lid wafer 20 and the interconnect layers 50 as in hermetic device 10. Since the interconnect layers 500 need no longer be hermetic, the materials chosen for use in the interconnect layer may be chosen for cost and convenience, rather than hermeticity. In the embodiment described in further detail below, the dielectric material may be a photo-patternable polymer, such as AZ9260. As used herein, the term "dielectric" should be understood to mean a material which is substantially insulating, such that, for example, less than about 1% of the current flows across the dielectric between the metallization layers. The dielectric features may then be formed in the photo-patternable polymer photolithographically.

Also, because the electrical connections to the microstructure 800 are provided by through wafer vias 620, the electrical bond pads 900 accessing device 800 may be located on the back side of the via wafer 600, and substantially inside the perimeter of the bond line 300. The term "substantially inside the perimeter" should be understood to mean that the center of the bond pads may be located within at least about one bond pad width of the footprint of the outside edge of the bond line, if not entirely within the footprint of the outside edge. The bond pads may be used to probe the device for functionality, or for wire bonding the device to, for example, a controlling ASIC. Such a placement of the bond pads may result in a required die area of only about 50% of the die area required by hermetic switch device 10, depending on the number and type of encapsulated microstructures 800.

Furthermore, because the vias 620 route the signal vertically, away from bond line 300, the capacitive coupling between the signal lines and the metal bond line 300 may be reduced compared the hermetic device 10. Hermetic device 100 may therefore be capable of handling higher frequency signals than hermetic switch device 10. Also, because the vias 620 act as thermal sinks, hermetic device 100 may be capable of handling larger currents than hermetic device 10, because the metallic vias route the heat quickly and efficiently to the metallization layer on the back side of the via substrate. Accordingly, by using the approach illustrated in FIG. 2, the vias which connect the MEMS device to the interconnect are relatively short, as opposed to bonding the device to a separate circuit board. By keeping the circuit lengths short, the design provides the better heat transfer, less cross-talk and inductance, less signal loss, and decreased resistance.

Finally, because the MEMS device is formed on the opposite side of the substrate from the interconnect, the layers of the interconnect need not be planarized because no precision lithography will be performed on their surface. Therefore, a substantial amount of topography may be allowed on the surface of the interconnect, without interfering with the functioning of the device. This may simplify the fabrication process, ease process development and improve process yields.

Figure 3:
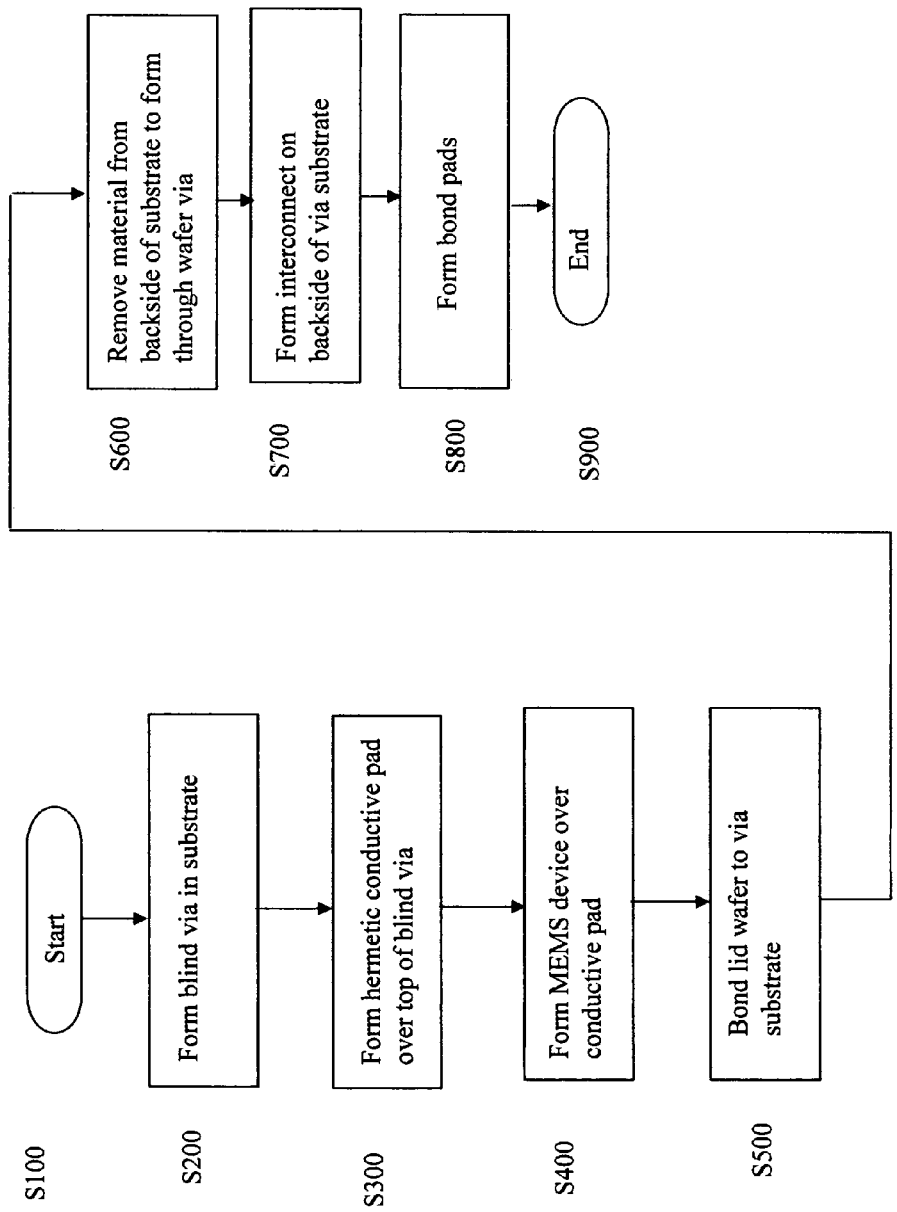
FIG. 3 is a flowchart of an exemplary method for forming the hermetic device using through wafer vias.
Figure 4:
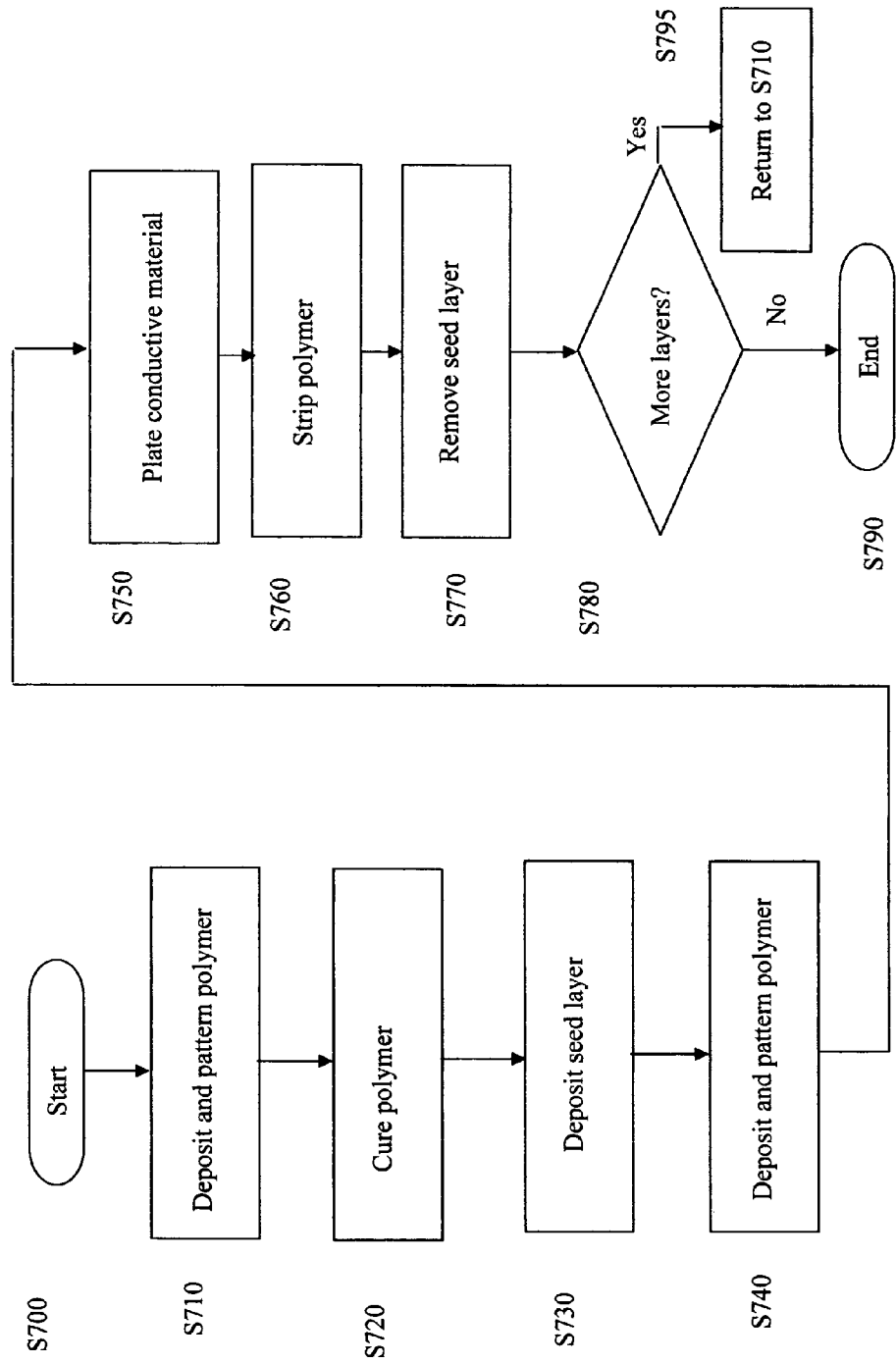
FIG. 4 is a flowchart showing additional detail of the method for forming the interconnect structure.

FIG. 3 is a flowchart of an exemplary method for manufacturing device 100 shown in FIG. 2. FIG. 4 shows additional detail of step S700 of FIG. 3. The method illustrated in FIGS. 3 and 4 will be described briefly below, and in greater detail with respect to FIGS. 5-15, which illustrate the various steps of the process set forth in FIGS. 3 and 4.

The process set forth in FIG. 3 begins in step S100 and proceeds to step S200, wherein a blind via is formed in a blind hole on a front side of a substrate. The term "blind hole" should be interpreted to be a hole with a dead end wall, that is, not penetrating through the substrate. The blind hole may be filled with a conductive material, to form a blind via.

In step S300, a conductive pad is formed over the top of the blind via, of sufficient thickness to provide a barrier to the transmission of gasses. In step S400, a MEMS device is formed over the conductive pad. In step S500, a lid wafer is bonded to the via wafer, to encapsulate the MEMS device. In step S600, material from the back side of the via wafer is removed to form the through wafer vias, by removing the dead end wall of the blind via. In step S700, the interconnect structure is formed on the back side of the via wafer. In step S800, bond pads are formed on the interconnect structure, allowing electrical access to the encapsulated MEMS device. The process ends in step S900.

It should be understood that not all the steps shown in FIG. 3 may be necessary, and that the steps may not necessarily be performed in the order shown. For example, the interconnect may be formed in step S700 before formation of the conductive pad and MEMS device in steps S300 and S400. This approach may be advantageous if the interconnect is to be made out of thin layers using plasma enhanced chemical vapor deposition (PECVD) nitride and thin-film deposited metals, for example. In addition, the material may be removed from the back side of the via substrate in step S600 before formation of the MEMS device in step S400. Furthermore, the formation of the hermetic conductive pad in step S300 may be omitted, if the design does not require it.

Additional detail of step S700 is shown in FIG. 4. The process begins and proceeds to step S710, wherein a photo-patternable polymer is deposited on the back side of the via substrate and patterned. The photo-patternable polymer is then cross-linked or cured in step S720, because it is intended to remain permanently on the structure, forming the first dielectric layer of the interconnect. This layer is intended to electrically isolate the subsequent metallization layer from the substrate, as well as to reduce the capacitive coupling of that layer to the substrate. In step S730, a seed layer for the later deposition of the first metallization layer is deposited. In step S740, another layer of photo-patternable polymer is deposited over the seed layer, and patterned according to the desired circuit layout of the metallization layer. In step S750, the conductive material is deposited on the exposed seed layer. In step S760, the remaining photo-patternable polymer is stripped from the substrate. The exposed seed layer is then removed in step S770. In step S780, a determination is made whether the design calls for additional metallization layers in the interconnect structure. If so, the process returns to step S710 and repeats. If not, the interconnect is complete, and the last metallization layer may be the bond pads for wire bonding to the device, for example. The process ends in step S790.

As with FIG. 3, not all of the steps illustrated in FIG. 4 may be required to practice the method, and the steps need not necessarily be carried out in the order indicated in FIG. 4.

The process set forth in FIGS. 3 and 4 is illustrated in FIGS. 5-15, which depict the formation of a second exemplary embodiment of device 1000.

Figure 5:
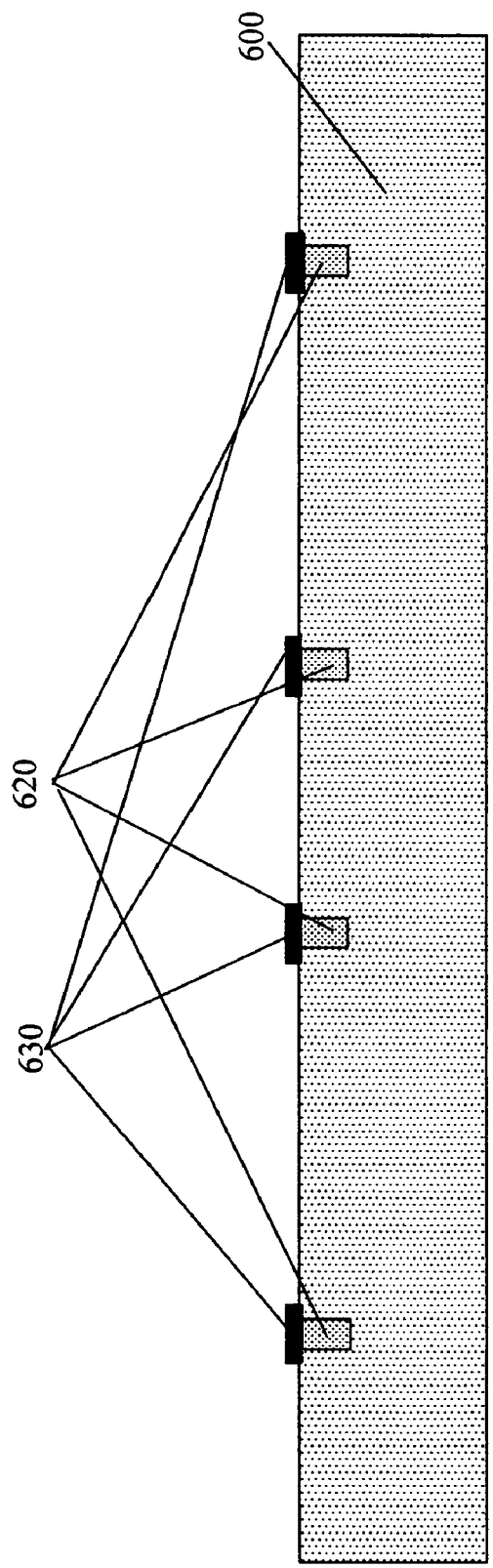
FIG. 5 is a cross sectional view of an exemplary substrate after the formation of the blind vias.

FIG. 5 is a cross sectional view of an exemplary substrate 600 after the formation of the blind vias 620 in a front side of the via substrate 600. The material of via substrate 600 may be any convenient material such as silicon, with a starting thickness of about 500 μm. The substrate may also be made of any other convenient material, such as germanium, glass, metal or ceramic. The substrate may also be a silicon-on-insulator (SOI) substrate widely used in MEMS fabrication, however, some slightly different process steps may be employed for the use of the SOI substrate. These different process steps will be pointed out in the process flow described below.

In this illustration, four vias 620 are shown, however, it should be understood that many more may be present, depending on the design requirements of the application. The blind vias 620 may be formed by deep reactive ion etching a blind hole to a prescribed depth, for example, about 80 μm to about 150 μm deep and 20 μm to about 50 μm wide into the 500 μm thick silicon wafer. An insulating layer may then be deposited or grown conformally over the surface, in order to isolate the vias electically from the substrate 600 and from each other. A plating seed layer structure may then be deposited over the insulating layer. The seed layer structure may be, for example, a thin layer of chromium as an adhesion layer, followed by a thicker layer of gold (Au). The initial adhesion layer of Cr may be deposited at thicknesses of 50 Angstroms up to 1500 Angstroms, while the conductive seed layer of gold may be deposited at thicknesses of 3000 Angstroms up to one micron or more, so long as reasonably low resistance conductive path is made to the bottom of the blind vias. The Cr/Au seed layer structure may be deposited by, for example, chemical vapor deposition (CVD), ion beam deposition, e-beam deposition, evaporation or sputtering.

A conductive material, for example copper (Cu) may then be plated or otherwise deposited into the blind hole. The copper may be deposited using reverse pulse plating as described in additional detail in co-pending U.S. patent application Ser. No. 11/482,944, filed Jul. 10, 2006 and incorporated by reference herein in its entirety.

Alternatively, the blind vias 620 may be formed in a device layer or in the handle layer of a silicon-on-insulator (SOI) wafer, wherein the buried oxide layer forms a convenient etch stop for the DRIE process.

Conductive pads 630 are then deposited over the blind holes 620 on a front side of the via substrate. The conductive pads may be of sufficient thickness to provide a barrier to the transmission of gasses. In one exemplary embodiment, the conductive pad is gold (Au) and between about 2500 Angstroms and about 1 μm thick. The conductive pads 630 may be formed by first depositing an adhesion layer such as chromium (Cr), followed by a layer of Au. A barrier layer, for example, molybdenum (Mo) or titanium tungsten (TiW) may also be used to prevent the chromium of the adhesion layer from diffusing into the gold of the pad. As with the plating seed layer, the Cr adhesion layer may be between about 50 Angstroms and about 1500 Angstroms thick, and the optional Mo layer may be about 100 Angstroms thick. Also, pads may be placed on the back side surface of the substrate rather than, or in addition to, the front side to help provide the hermetic seal.

The conductive pads 630 may be formed so that the edges extend slightly beyond the vias, about 5 μm beyond is typically sufficient to allow a misalignment tolerance and a good seal. The gold pads 630 can be formed using a lift-off process, or deposited, patterned and etched using dry or wet processes.

In addition to providing a barrier to the transmission of gasses, the pads 630 may also serve to keep the copper blind vias 620 from oxidizing during processing. Pads 630 may also be used as a switch contact as was shown in FIG. 2.

Figure 6:
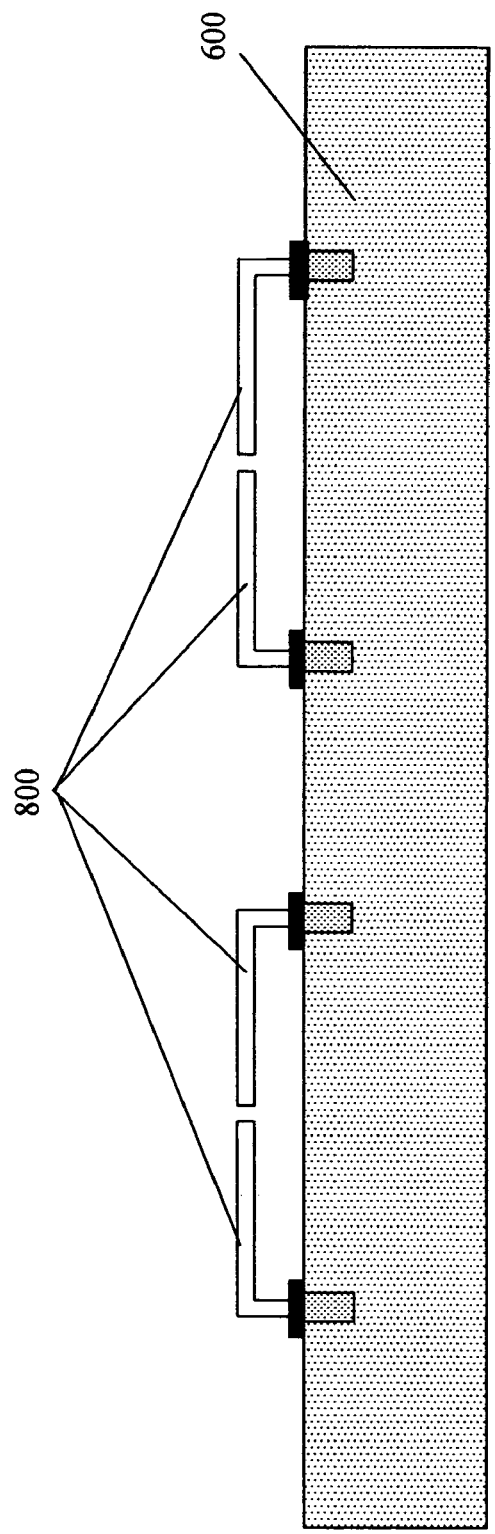
FIG. 6 is a cross sectional view of the exemplary substrate after formation of the microstructures.

FIG. 6 is a cross sectional view of the exemplary substrate 600 after the formation of MEMS devices 800 on top of the conductive pads 630. Although a cantilevered MEMS device is illustrated in FIG. 6, it should be understood that MEMS devices 800 may be any of a number of switches, sensors or actuators, of virtually any design, and made using any of a number of bulk or surface machining processes well known in the MEMS art.

For example, the cantilevered device 800 may be fabricated on the via substrate 600 by first plating a sacrificial copper layer, then plating gold contacts over the sacrificial layer, and/or on the via substrate 600. A cantilevered nickel beam may then also be plated over the sacrificial copper layer. Finally, after removing the sacrificial copper layer, the nickel beam with gold contacts is free to bend about its anchor point. U.S. patent application Ser. No. 11/263,912, incorporated by reference in its entirety, sets forth further details of the formation of a nickel cantilevered thermal MEMS switch which may be formed over a via substrate 600.

Alternatively, the MEMS device 800 may be made by forming moveable features in the device layer of another SOI wafer by, for example, deep reactive ion etching (DRIE) with the oxide layer forming a convenient etch stop. The movable feature is then freed by, for example, wet etching the oxide layer from beneath the moveable feature. The device layer may then be bonded face to face with a via substrate. The inner surface of the via substrate may be an integral part of the MEMS device, for example, switch contacts may be placed directly over the vias. Additional details as to the method of manufacture of such a cantilevered MEMS switch may be found in U.S. patent application Ser. No. 11/211,623, U.S. patent application Ser. No. 11/211,624 and U.S. patent application Ser. No. 11/359,558.

However, it should be understood that the MEMS device 800 may be any of a number of devices other than the switches described in the incorporated '912 application, '623 application, '624 application, or '558 application, such as accelerometers, sensors, actuators, and the like. Since the details of the MEMS device 800 are not necessary to the understanding of the systems and methods described here, it is depicted only schematically in FIG. 6. Similarly, the systems and methods disclosed here may also be applied to passive MEMS or non-MEMS devices, as well as to integrated circuits using the through wafer via substrate 600.

Figure 7:
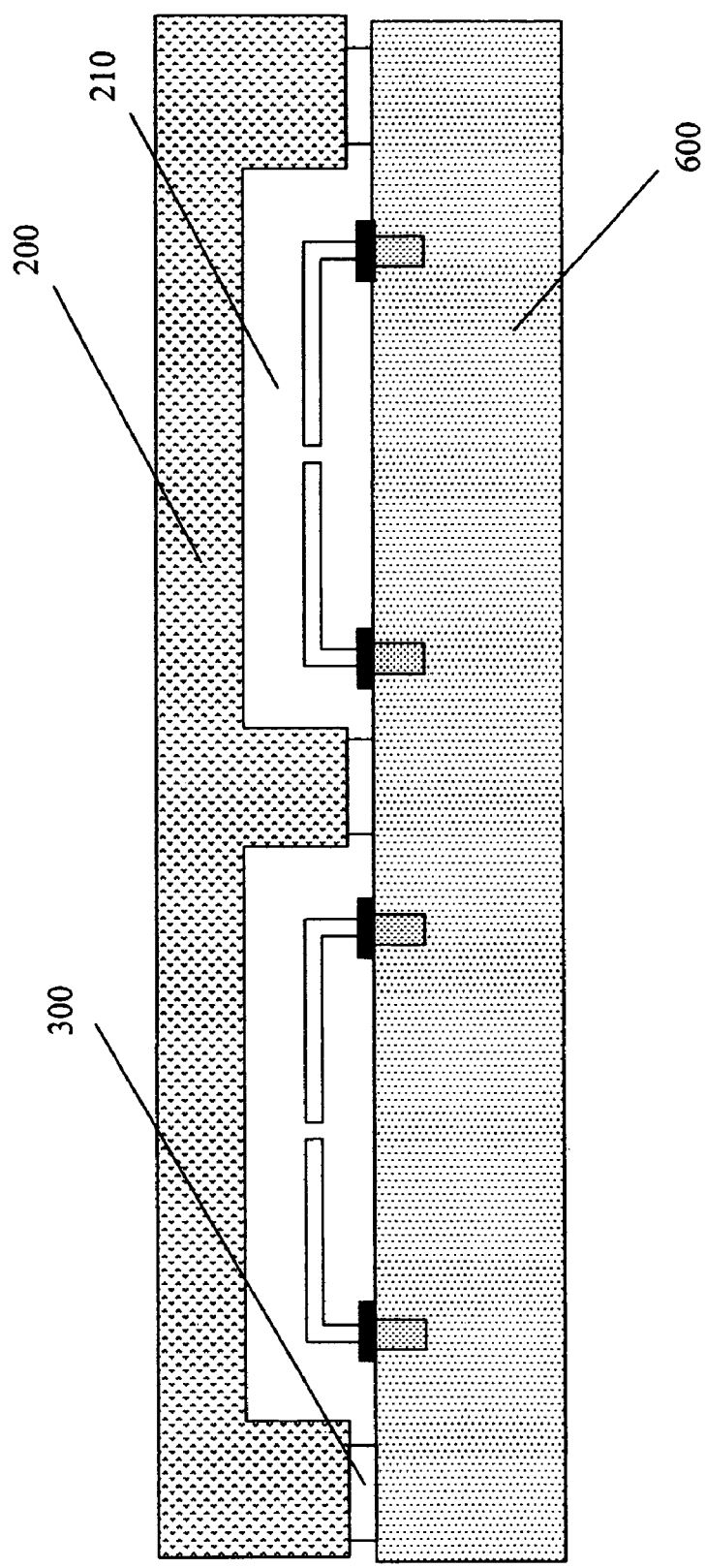
FIG. 7 is a cross sectional view of the exemplary substrate after bonding of a lid wafer to the substrate.

Having formed the MEMS devices 800 on the via wafer, the MEMS devices may then be encapsulated by bonding the front side of the via wafer 600 to a lid wafer 200, as shown in cross section in FIG. 7. Cavities 210 may have been previously etched in the lid wafer 200 to provide clearance for the movement of the MEMS devices 800. A hermetic seal may be made using any suitable adhesive 300, which may be applied to the bonding surfaces of the lid wafer 200 or the via wafer 600, or both. For example, the hermetic seal may be a metal alloy seal as taught in greater detail in U.S. patent application Ser. No. 11/211,625 and U.S. patent application Ser. No. 11/211,622 incorporated by reference herein in their entireties. The metal alloy seal may be an alloy of gold (Au) layers and indium (In) layer, in the stoichiometry of $AuIn_x$. In various exemplary embodiments, x is about 2, such that the stoichiometry of the alloy is $AuIn_2$. The process for forming the gold/indium seal 400 may be heating the wafer pair to a temperature of about 160 to 180 degrees centigrade, whereas the melting point of indium is about 156 degrees centigrade. Upon melting of the indium, it combines with the gold to form the $AuIn_x$ alloy. Accordingly, by using such a metal alloy seal, processing temperatures may be limited to less than about 200 degrees centigrade for fabricating the encapsulated MEMS device 800. The gold layer of the hermetic seal may be formed at the same time and of the same material as conductive pads 630. Alternatively, the hermetic seal may be formed using a glass frit with embedded particles as a standoff, as taught in U.S. patent application Ser. No. 11/390,085, incorporated by reference herein in its entirety. Alternatively, the lid wafer may be bonded anodically to the via wafer, if the MEMS devices 800 are made with materials that can withstand the anodic bonding temperatures.

The via substrate 600 and lid wafer 200 may be placed in a wafer bonding tool, which may then be evacuated and filled with the preferred environment to be enclosed in the hermetic cavity. The preferred environment may be an insulating gas such as sulfur hexafluoride ($SF_6$) or a freon such as $CCl_2F_2$ or $C_2Cl_2F_4$. Alternatively, the environment may be one such as N2, H2 and vacuum, chosen for its other properties, for example, damping, to optimize other switch performance parameters, such as speed, rather than breakdown voltage. The preferred environment is then sealed within the hermetic device 1000 by curing the adhesive 300 to seal the lid wafer 200 to the via substrate 600. Depending on the pressure differential and the effectiveness of the bond, the preferred gas environment may remain in the device cavity 210 for the lifetime of the device. Because the wafer bonding process squeezes the adhesive 300 into a thin layer between the wafers, the adhesive 300 is no longer shown beyond FIG. 7.

Figure 8:
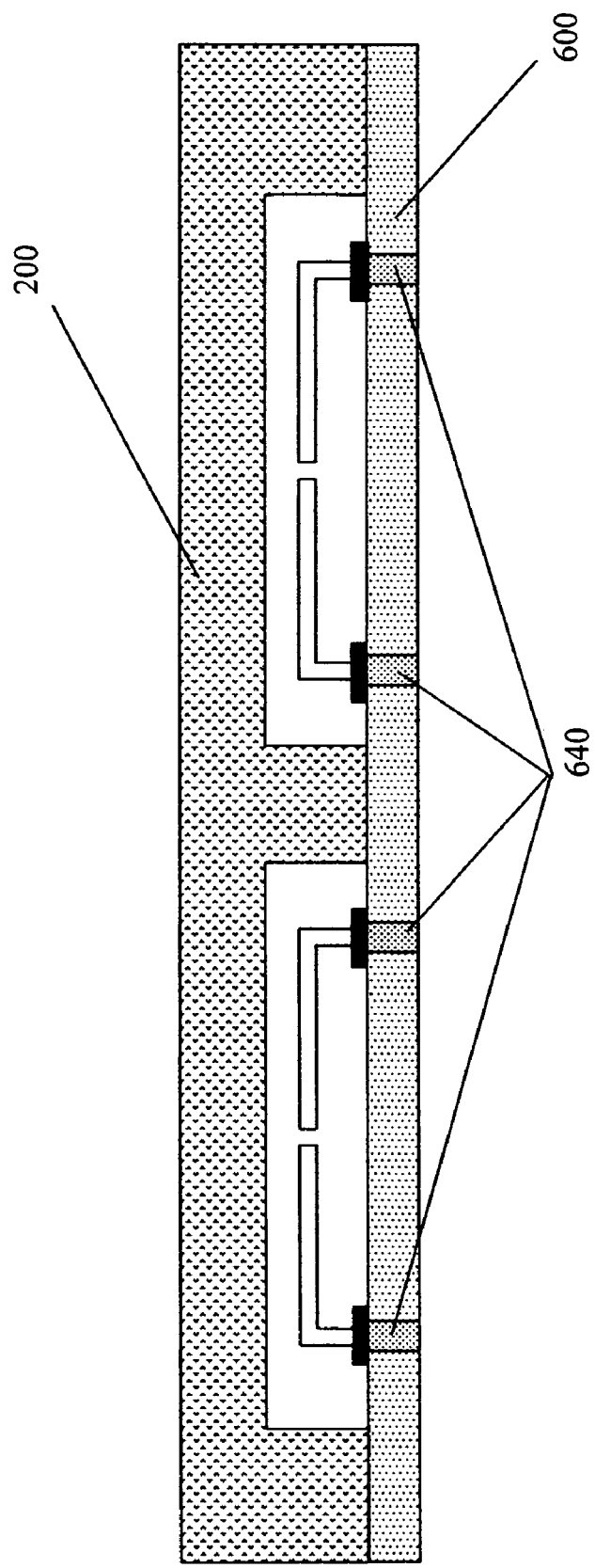
FIG. 8 is a cross sectional view of the exemplary substrate after removal of material from the back side of the substrate.

After bonding the lid wafer 200 to the front side of the via substrate 600, material may be removed from the exposed back side of the via substrate 600 up to and including the dead-end walls of the blind vias 620 to form the through wafer vias 640. FIG. 8 is a cross sectional view of the exemplary substrate after removal of material from the back side of the via wafer to form the through wafer vias 640. The material may be removed by, for example, isotropic dry etching, single-sided wet etching or grinding, lapping, and polishing the back side of the via substrate 600. In one embodiment, the means for removing material from the back side of the via substrate 600 may be a precision wafer grinder, such as a model VG-401 available from Okamoto of Japan. The grinder may use a metal wheel with diamond grit embedded in it as an abrasive. The rotation rate of the grinding wheel may be about 800 rpm, and the rotation rate of the table holding the substrate 600 may be about 80 rpm. Using these parameters, the grinding tool may be programmed to remove material at a rate of about 25 µm per minute for about 15 minutes, to remove about 375 µm to about 450 µm of material, leaving the through wafer via substrate 600 having a thickness of about 50 µm to about 125 µm. At this point, the blind vias 620 may become the through wafer vias 640.

Other techniques for removing material may be used, such as dry or single-sided wet etching, either alone or in combination with grinding, to remove about 400 µm of silicon from a 500 µm thick substrate, leaving about 100 µm of material as via substrate 600. The etching can be done either before, but typically after the MEMS devices 800 have been formed on the via substrate 600. Accordingly, using the methods described here, through wafer vias of diameter less than about 50 µm and depths of at least about 100 µm may be made. More particularly, the aspect ratio of the via, that is, the ratio of the depth of the via to its width, may be at least one-to-one, and as great as about eight-to-one.

Alternatively, instead of removing material from the back side of the via substrate 600, the through wafer vias 640 may be made using a silicon-on-insulator (SOI) composite substrate. The blind trenches 620 may be etched as described above through a thick, 50 um-100 um device wafer of a silicon-on-insulator wafer. The handle wafer may then be dry or wet etched, using the buried oxide as an etch stop. Vias may then be patterned in the now exposed, but previously buried oxide to ultimately allow a conductive path from subsequently defined metal pads and the through wafer vias. The buried oxide, being left on the majority of the substrate, also serves the purpose of electrical isolation between any metal pads and the substrate. In another alternative, the blind holes may be formed in the SOI handle layer, and the SOI device layer subsequently removed to form the through wafer vias.

Upon the removal of material from the back side of the via substrate 600 to form the through wafer vias 640, the device is ready for the formation of the interconnect structure 500.

Figure 9:
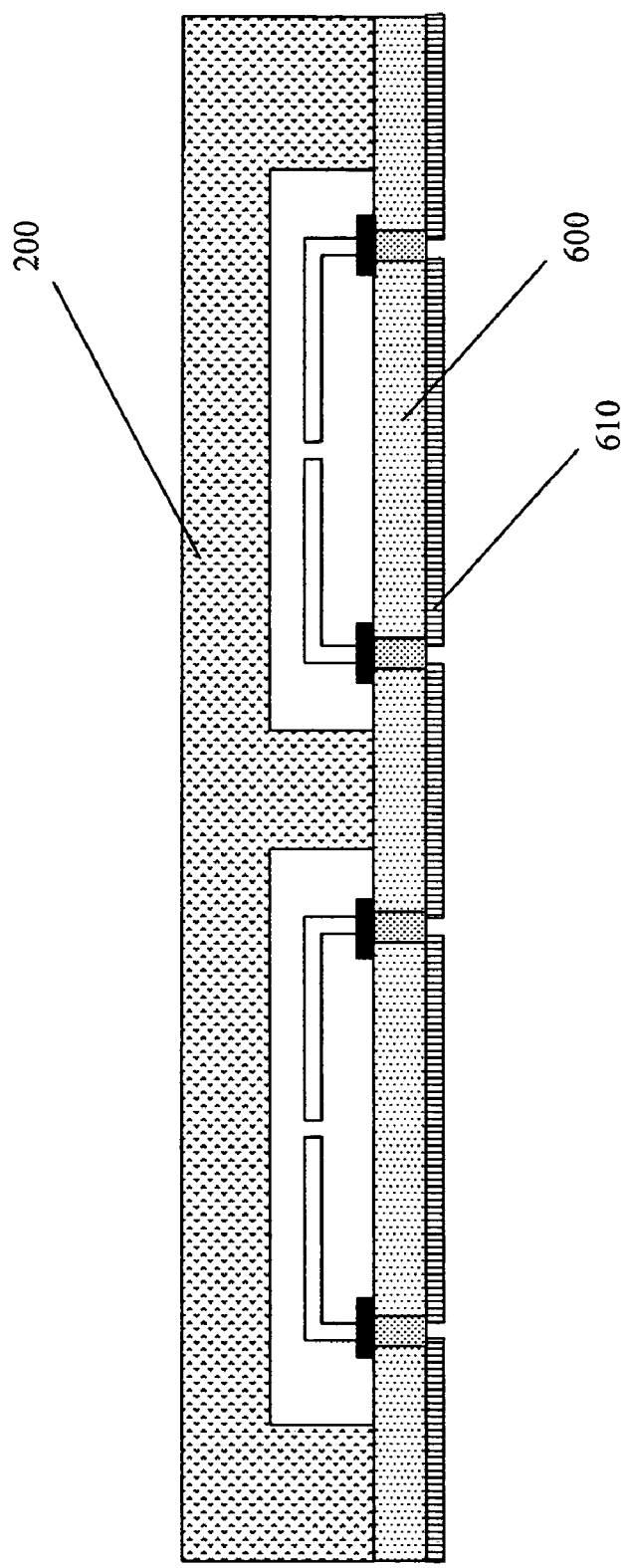
FIG. 9 is a cross sectional view of the exemplary substrate after deposition of a first dielectric layer.

The first step in the formation of first level 510 of the interconnect structure 500 may be the deposition of a dielectric layer. FIG. 9 is a cross sectional view of an exemplary via substrate 600 upon which a layer of dielectric material 610 has been deposited and patterned over the back side of via substrate 600. The dielectric material 610 may be an oxide or nitride, such as silicon dioxide, silicon nitride or tantalum oxide. Since this first layer of dielectric will also support the bond pads which are formed later, it may be important that a material be chosen with sufficient mechanical integrity to serve this purpose.

The dielectric material 610 may also be, for example, a photo-patternable polymer such as an acid-catalyzed phenol formaldehyde resin, also known as a Novolac photoresist. Various exemplary embodiments include SU-8 or BCB photoresists. In one embodiment, the dielectric material 610 is AZ9260, a positive tone Novolac photoresist manufactured by Clariant Corporation of Muttenz, Switzerland. The thickness of the photo-patternable polymer dielectric layer 610 may be between about 0.1 µm and about 10 µm, and more preferably may be about 5 µm thick, for example. The photo-patternable polymer dielectric layer 610 may be sprayed on, spun on or dipped, for example. The photo-patternable polymer dielectric layer 610 may then be exposed and developed, leaving an aperture at the location of the through wafer vias 640. The photo-patternable polymer dielectric layer 610 may then be cross-linked or cured, as it is intended to remain permanently on the back side of the via substrate. The cross-linking or curing may be performed in about a 1% to 2% partial pressure of oxygen ($O_2$) in a nitrogen ($N_2$) atmosphere, at a temperature of, for example, 240 degrees Centigrade for a duration of, for example, 90 minutes. The cross-linking or curing serves to fix the photo-patternable polymer dielectric layer 610 to the via substrate 600 surface, and also to round the corners of the photo-patternable polymer dielectric layer 610, so that a seed layer may be deposited conformally over the surface, without forming gaps which would inhibit the use of the seed layer as a plating base.

A seed layer (not shown) may then be deposited conformally over the photo-patternable polymer dielectric layer 610. The seed layer may include again about a 200 Angstrom thick chromium (Cr) adhesion layer in combination with a thicker, at least 1000 Angstrom thick copper (Cu) seed layer. The Cr/Cu seed layer structure may be deposited by, for example, chemical vapor deposition (CVD), ion beam deposition, e-beam deposition, evaporation or sputtering. This seed layer will provide the plating base layer for the plating step of the first layer of metallization, to follow. The seed layer may then again be covered with a photo-patternable polymer (not shown), such as an acid-catalyzed phenol formaldehyde resin. The photo-patternable polymer may then be exposed in areas where the metallization is to be deposited. The photo-patternable polymer may then be developed, to form a polymer stencil for the plating step. The developed polymer may form apertures over a subset of the through wafer vias 640, such as over through wafer via 642, for the subsequent deposition of the first layer of metallization.

Figure 10:
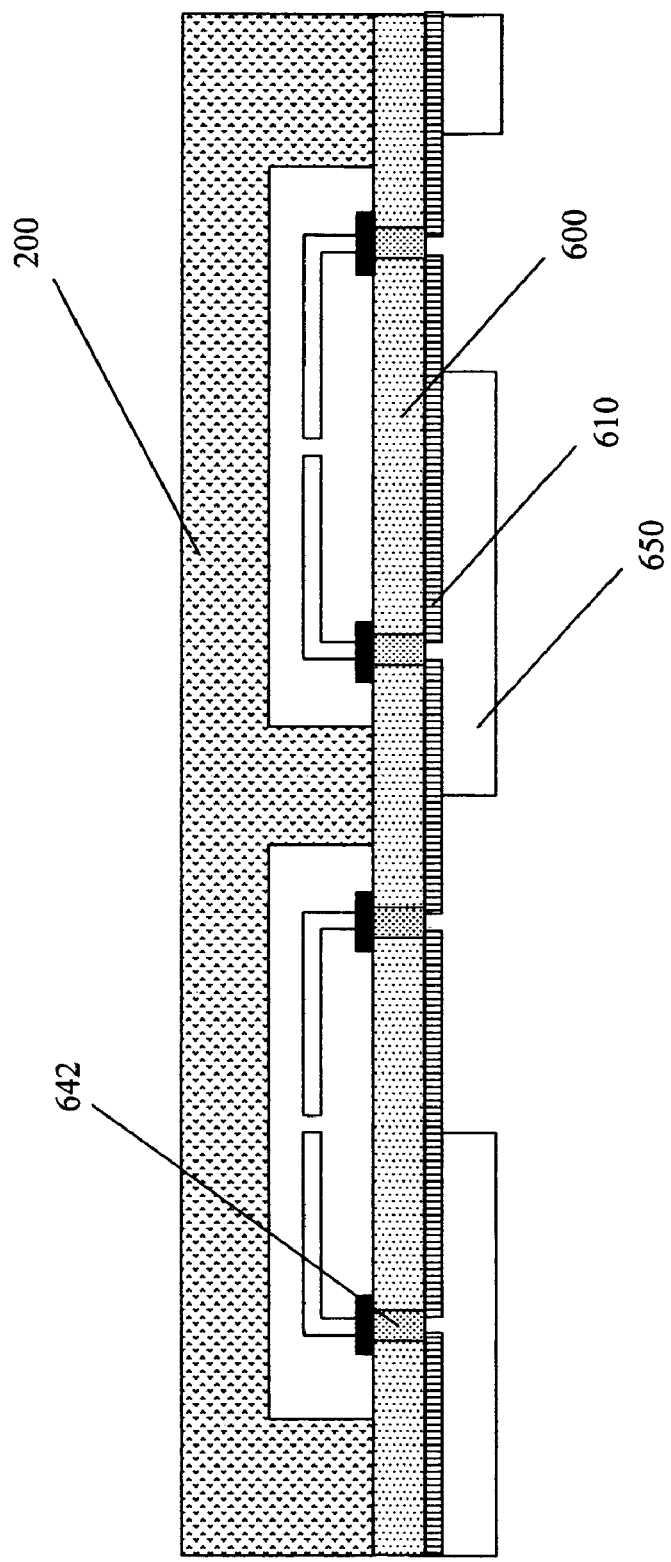
FIG. 10 is a cross sectional view of the exemplary substrate after deposition of the first layer of metallization.

The via substrate 600 and lid wafer 200 may then be immersed in a copper plating bath, containing, for example, copper sulfate and sulfuric acid and plating between about 0.1 µm to about 10 µm of copper. In one embodiment, the plated metallization layer is about 5 µm thick. However, it should be understood that this embodiment is exemplary only, and that any other suitably conductive material which can be plated or otherwise deposited on the substrate, including gold (Au) or nickel (Ni), may be used in place of copper, and any other thicknesses appropriate for the application may be used. After the plating is complete, the polymer stencil may be removed from the substrate surface with a suitable solvent, leaving the plated copper as the first metallization layer 650 of the interconnect. The remaining seed layer is then etched from the surface of the first polymer dielectric layer 610, using, for example, acetic acid with hydrogen peroxide for the Cu and potassium ferricyanide for the Cr. The condition of the via substrate 600 after the plating of the first metallization layer 650 is shown in cross section in FIG. 10. The first metallization layer 650 may provide electrical access to one or more of the through wafer vias 642, as shown in FIG. 10.

The second interconnect level 550 of interconnect structure 500 is then begun by the application of another layer of dielectric material 660 to the surface of the via substrate 600, over the first metallization layer 650.

Figure 11:
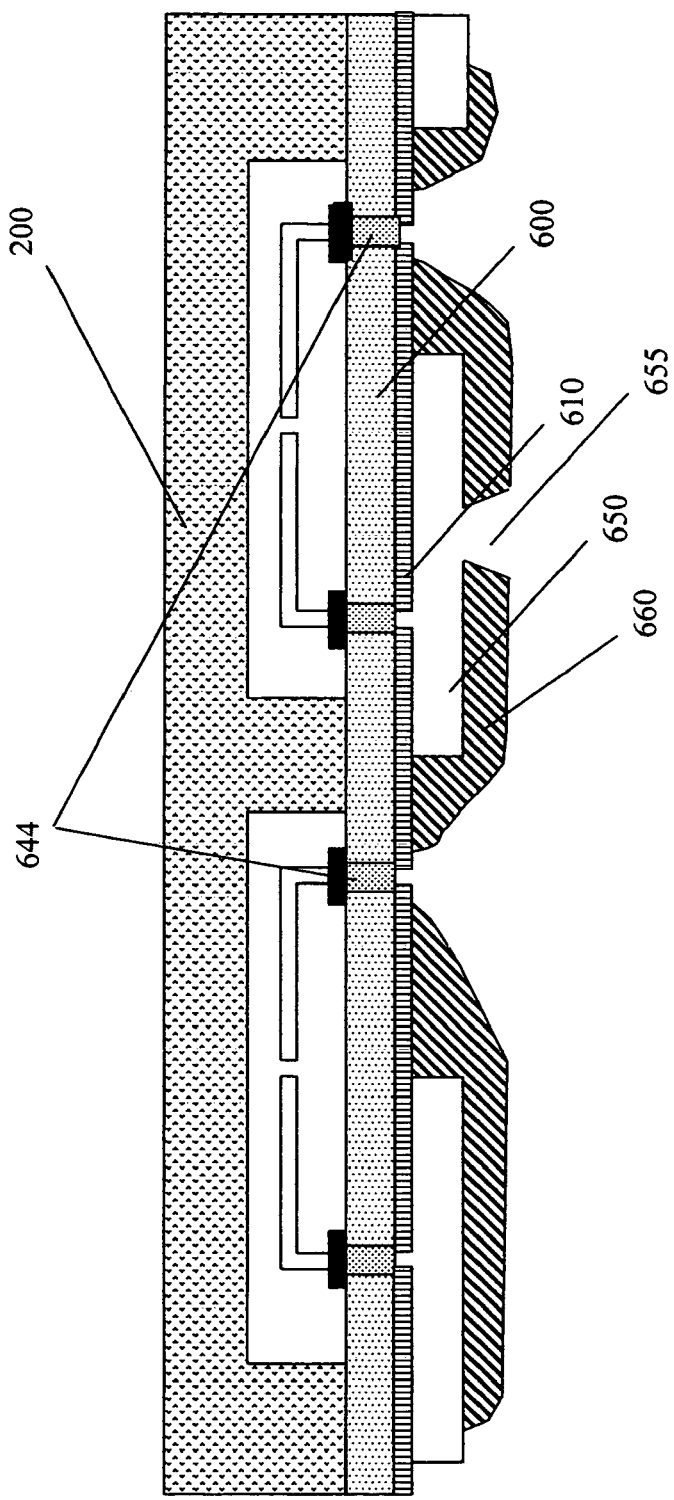
FIG. 11 is a cross sectional view of the exemplary substrate after deposition of a second dielectric layer.
Figure 12:
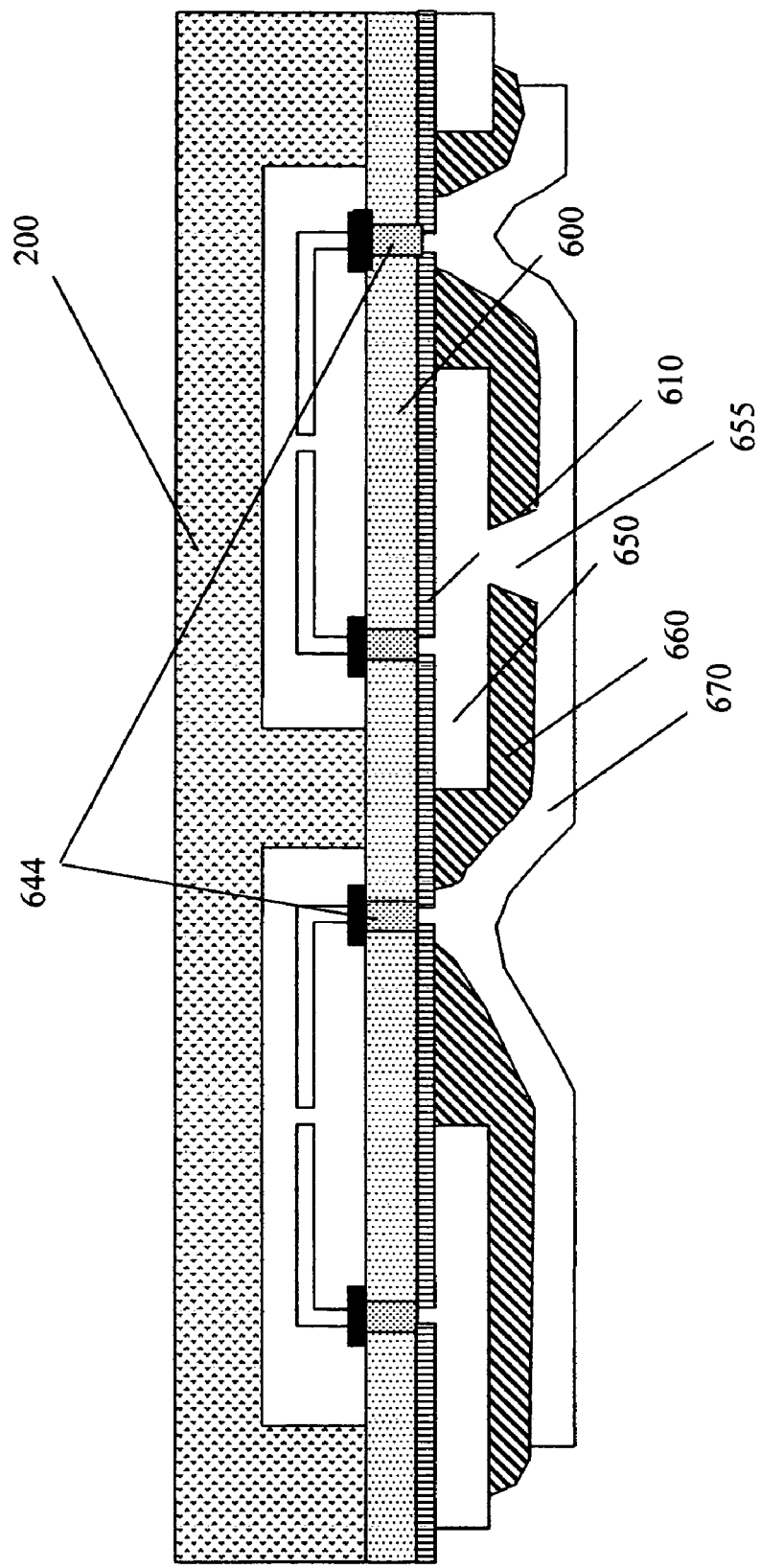
FIG. 12 is a cross sectional view of the exemplary substrate after deposition of a second layer of metallization.

FIG. 11 is a cross sectional view of the exemplary via substrate after the deposition of the second dielectric layer 660 of the interconnect. The second dielectric layer 660 may again be a photo-patternable polymer such as AZ9260, with a thickness of between about 0.1 µm to about 10 µm. There may be substantial topography on the back side surface of the via substrate 600 because of the presence of the first plated metallization layer 650. However, the lithography being performed on the photo-patternable polymer 660 need not be high precision, and thus no planarization of the surface may be required.

The photo-patternable polymer 660 is exposed, developed and cross-linked or cured similarly to interconnect dielectric layer 610, described previously to form the second dielectric interconnect layer 660. Upon patterning, the dielectric material 660 may cover all areas of the first metallization layer, and the only apertures may be over another subset of the through wafer vias 644, as shown in FIG. 11 as well as over portions 655 of the first metallization layer to which the second metallization layer will be electrically connected.

Another seed layer (not shown) of Cr and Cu, for example, may then be deposited conformally over the second dielectric interconnect layer 660. In areas where the photo-patternable polymer layer 660 has been removed, the seed layer may be in direct contact with a subset of the underlying through wafer vias 644 and inter-layer aperture 655, such that the subsequently deposited second metallization layer will be electrically coupled to the subset of the through wafer vias 642 and inter-layer apertures 655. The seed layer may then be covered with another layer of photo-patternable polymer (not shown), which is exposed and developed according to the circuit layout for the second metallization layer. This layer of photo-patternable polymer thus forms a polymer stencil for the plating of the second metallization layer. The second metallization layer 670 is then plated similarly to the first metallization layer 650, to a thickness of between about 0.1 µm to about 10 µm. The condition of the via substrate 600 after plating of the second metallization layer 670 is shown in cross section in FIG. 12. The photoresist stencil is then stripped from the substrate, and the remaining areas of the seed layer are then etched from the second dielectric interconnect layer 660.

Figure 13:
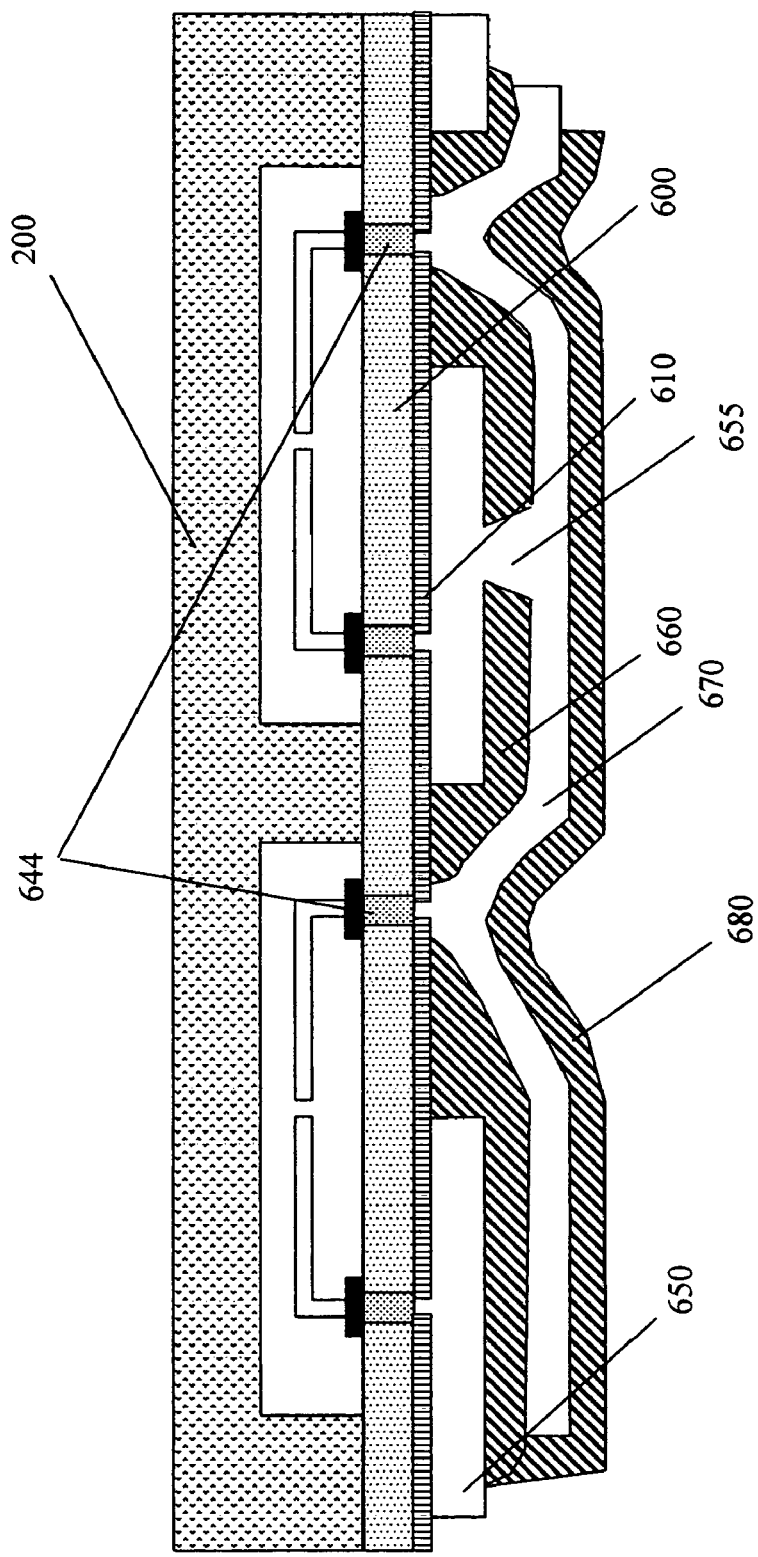
FIG. 13 is a cross sectional view of the exemplary substrate after deposition of another layer of dielectric material.

Another layer of photo-patternable polymer 680 may then be deposited over the second dielectric interconnect level 660 and second metallization layer 670. The photo-patternable polymer layer 680 is then exposed and developed in areas in which the bonding pads will be formed, and a connection to the underlying metallization layers is desired. The condition of the via substrate after the deposition of photo-patternable polymer layer 680 is shown in FIG. 13. For example, on the right side of FIG. 13, the photo-patternable polymer is exposed and removed in areas over the second metallization layer 670, whereas on the left-hand side of FIG. 13, the photo-patternable polymer is exposed and removed in areas over the first metallization layer 650.

Figure 14:
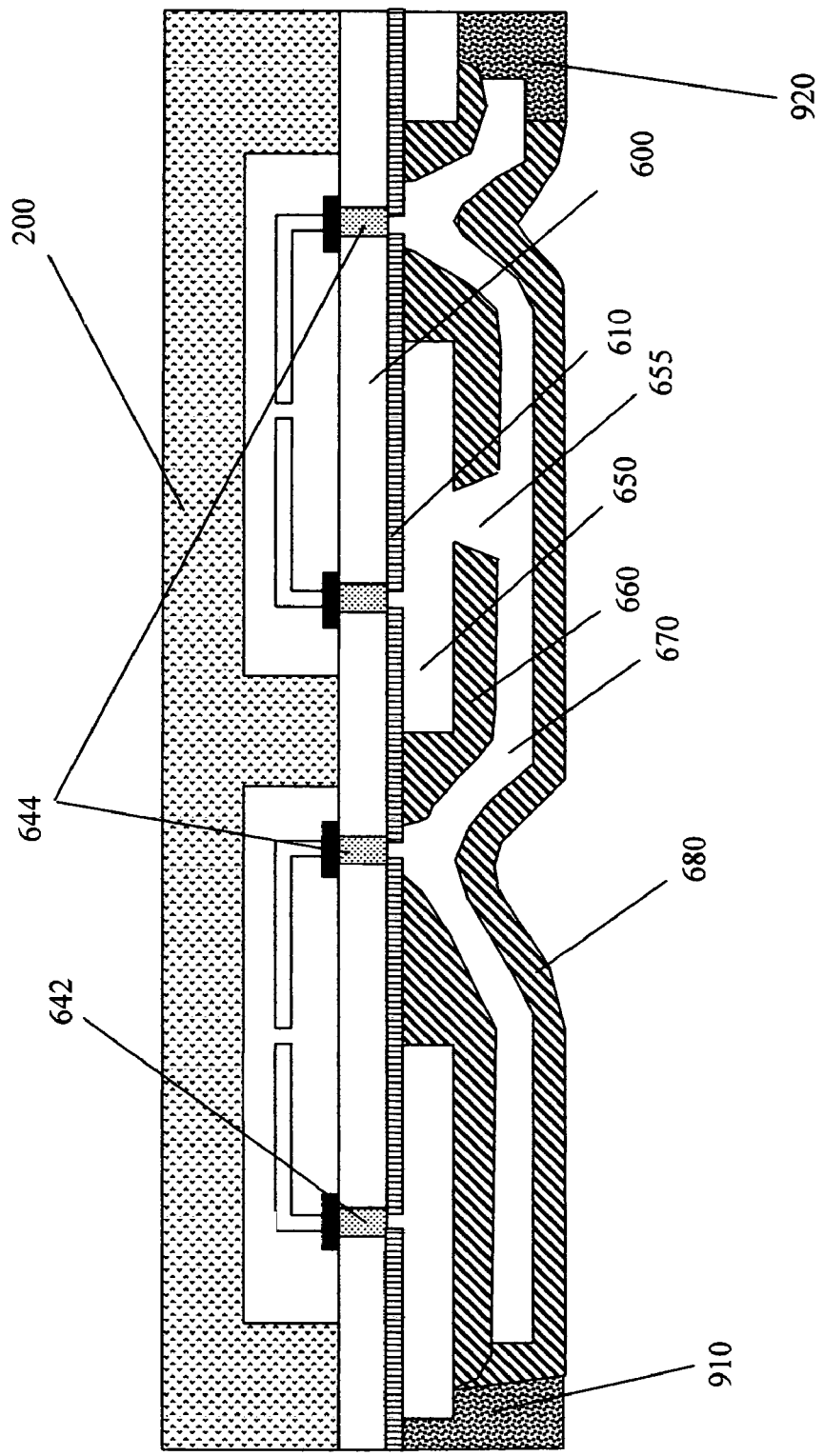
FIG. 14 is a cross sectional view of the exemplary substrate after formation of the bond pads.

Another seed layer (not shown) may then be deposited over this layer of photo-patternable polymer. The seed layer is followed by another layer of photo-patternable polymer, which is exposed and developed in areas where the bond pads will be formed. The bond pads 910 and 920 are then plated on the exposed areas of the seed layer, corresponding to the desired location of the bond pads. Left bond pad 910 may provide access to the first metallization layer 650, and bond pad 920 may provide access to the second layer of metallization 670. Accordingly, the left hand bond pad 910 may activate the left hand MEMS device 810 using through wafer via 642, whereas the right hand bond pad 920 may activate the right hand MEMS devices 820 using through wafer vias 644, as shown in FIG. 14.

Figure 15:
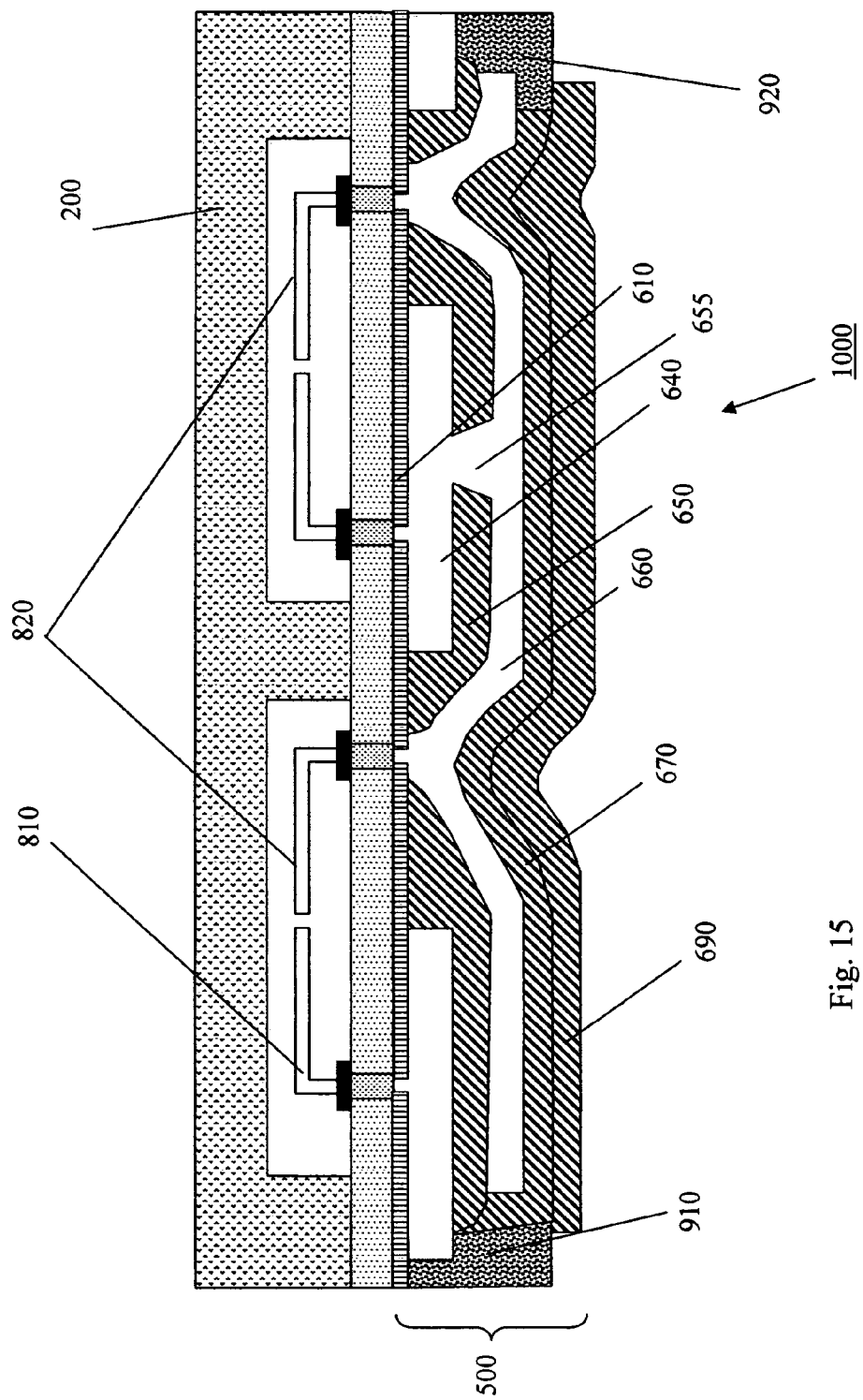
FIG. 15 is a cross sectional view of the exemplary substrate after formation of a dielectric passivation layer.

The device 1000 may be completed by depositing a passivating layer 690 over the back side of the via substrate 600, as shown in FIG. 15. The passivating layer may be, for example, 20 µm to 100 µm thick, and may be, for example, a polyimide capping material. This capping material may provide additional protection to the interconnect structure, and provide the surface to which a controlling application-specific integrated circuit (ASIC) may be bonded. Interconnect 500 and hermetic device 1000 is thereby completed.

Although interconnect 500 is described above as having only two metallization layers, it should be understood that the process steps outlined above may be repeated to form an interconnect with an essentially unlimited number of metallization layers. Such larger interconnect structures may be useful in providing access to microstructures with a larger number of input and output signal lines, as well as a larger number of such microstructures. In this event, the interconnect structure 500 may serve to reduce the total area required by the microstructures and their bond pads.

As mentioned above, a number of different dielectric materials, such as oxides or nitrides, may be substituted for the photo-patternable AZ9260 polymer described with reference to the above embodiment. However, process details used in the formation of the dielectric layers 660 and 680 of interconnect 700 may need to be altered to be consistent with the choice of dielectric material. Similarly, metallization layers 650 and 670 are formed by electroplating copper in the embodiment described above. However, it should be understood that any of a variety of metals may be used to form metallization layers 650 and 670, but that the processes used to form these metallization layers may need to be altered to be consistent with the choice of metal material.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, an exemplary MEMS switch is described as an application for the interconnect technology described herein. However, it should be understood that the MEMS switch is exemplary only, and that the interconnect technology may be applied to any of a wide variety of other structures or devices. Furthermore, many of the process details may be substituted by similar or equivalent processes to form the same or similar structures. Accordingly, the exemplary implementations set forth above, are intended to be illustrative, not limiting.

What is claimed is:

1. A device, comprising:
   a via wafer with at least two vias extending through a thickness of the via wafer;
   at least one MEMS microstructure formed on a first side of the via wafer, and electrically coupled to the at least two vias; and
   an interconnect structure formed on a second side of the via wafer, including at least one layer of dielectric material disposed over the second side and at least one layer of metallization disposed over the layer of dielectric material, which spans and electrically couples the at least two vias, wherein the at least one layer of metallization is electrically isolated from the via wafer by the at least one layer of dielectric material.

2. The device of claim 1, further comprising:
   at least one additional layer of dielectric material disposed adjacent to the at least one layer of metallization; and
   at least one additional layer of metallization disposed adjacent to the at least one additional layer of dielectric material and electrically coupled to the first layer of metallization.

3. The device of claim 2, wherein the at least one layer additional layer of metallization is electrically coupled to at least one additional via.

4. The device of claim 1, further comprising:
   a lid wafer bonded to the via wafer with a bond line having a perimeter around the at least one microstructure and forming a hermetic cavity enclosing the at least one microstructure, wherein the bond line is a hermetic metallic bondline which forms a hermetic seal around the hermetic cavity, encapsulating the MEMS microstructure within the hermetic cavity.

5. The device of claim 4, wherein the hermetic metallic bond line comprises an AuIn$_x$ alloy, wherein x is about 2.

6. The device of claim 1, further comprising conductive pads formed over the at least two vias within the cavity, wherein the conductive pads comprise gold, at least about 2500 Angstroms thick, and the at least two vias comprise copper.

7. The device of claim 1, wherein the layer of dielectric material is a photo-patternable polymer.

8. The device of claim 7, wherein the photo-patternable polymer is an acid-catalyzed phenol formaldehyde resin.

9. The device of claim 1, wherein the layer of metallization comprises at least one of copper, gold and nickel.

10. The device of claim 9, wherein the layer of metallization further includes a seed layer of chromium and copper.

11. The device of claim 1, wherein the layer of metallization is between about 0.1 µm to about 10 µm thick, and the layer of dielectric material is between about 0.1 µm to about 10 µm thick.

12. The device of claim 4, further comprising at least one bond pad disposed on the interconnect structure and electrically coupled to the at least one layer of metallization.

13. The device of claim 12, wherein each of the at least one bond pads is located substantially within the perimeter of the bond line.

14. The device of claim 4, wherein the bond line comprises an AuIn$_x$ alloy, wherein x is about 2.

15. A method for making a device, comprising:
   forming a via wafer with at least two vias extending through a thickness of the via wafer;
   forming at least one MEMS microstructure on a first side of the via wafer, and coupling the at least one MEMS microstructure to the at least two vias;
   forming an interconnect structure on a second side of the via wafer, including at least one layer of dielectric material disposed over the second side and at least one layer of metallization disposed over the layer of dielectric material, which spans and electrically couples the at least two vias; coupling a lid wafer to the via wafer with a bondline having a perimeter around the at least one MEMS microstructure to form a hermetic cavity enclosing the at least one MEMS microstructure; and
   electrically coupling the at least one layer of metallization to the at least two vias but isolating the metallization from the via wafer by the at least one dielectric layer.

16. The method of claim 15, further comprising:
   forming an additional layer of dielectric material adjacent to the at least one layer of metallization
   forming an additional layer of metallization adjacent to the at least one additional layer of dielectric material.

17. The method of claim 15, further comprising forming conductive pads over the at least two vias.

18. A device, comprising:
   a via wafer with a plurality of vias extending through a thickness of the via wafer;
   a plurality of MEMS microstructures formed within a single die on a first side of the via wafer, and electrically coupled to the plurality of vias;

and an interconnect structure formed on a second side of the via wafer, including a first layer of dielectric material disposed over the second side and a first layer of metallization disposed over the dielectric material and spanning and electrically coupling the plurality of vias, wherein the first layer of metallization is electrically coupled to the plurality of MEMS microstructures and to the plurality of vias, and the first layer of metallization is electrically isolated from the via wafer by the first layer of dielectric material.

19. The device of claim 18, further comprising a second layer of metallization electrically coupled to a subset of the plurality of MEMS microstructures through at least one other via, and is electrically isolated from the first layer of metallization by a second layer of dielectric material, wherein the second layer of metallization is coupled to at least one other via.

20. The device of claim 18, further comprising a lid wafer coupled to the via wafer with a hermetic bond line having a perimeter around the plurality of microstructures and forming a hermetic cavity enclosing the plurality of microstructures.

21. The device of claim 1, wherein the layer of dielectric material is formed between the substrate surface and the layer of metallization.

22. The device of claim 2, wherein the additional layer of dielectric is formed between the layer of metallization and the additional layer of metallization.

23. The device of claim 1, wherein the at least one layer of dielectric includes a plurality of voids, which are filled with the at least one layer of metallization.

24. The device of claim 2, wherein the at least one layer of metallization includes a plurality of voids, which are filled with the additional layer of dielectric material.

* * * * *